United States Patent
Ito et al.

(10) Patent No.: US 7,348,220 B2
(45) Date of Patent: Mar. 25, 2008

(54) RESIN-ENCAPSULATED TYPE SEMICONDUCTOR PACKAGES, AND PRODUCTION METHOD AND APPARATUS THEREFOR

(75) Inventors: Hideo Ito, Shingawa-ku (JP); Tamaya Ubukata, Mooka (JP); Yoshitaka Hirose, Mooka (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 52 days.

(21) Appl. No.: 10/556,144

(22) PCT Filed: Nov. 8, 2004

(86) PCT No.: PCT/JP2004/016534

§ 371 (c)(1),
(2), (4) Date: Nov. 9, 2005

(87) PCT Pub. No.: WO2005/106942

PCT Pub. Date: Nov. 10, 2005

(65) Prior Publication Data

US 2006/0223235 A1    Oct. 5, 2006

(30) Foreign Application Priority Data

Apr. 30, 2004    (JP) .............................. 2004-136535

(51) Int. Cl.
*H01L 21/00* (2006.01)
(52) U.S. Cl. .............................. 438/127; 257/E21.502
(58) Field of Classification Search ................ 438/106, 438/111, 127; 257/E21.502
See application file for complete search history.

(56) References Cited

U.S. PATENT DOCUMENTS

| 6,080,354 A * | 6/2000 | Miyajima ..................... 264/511 |
| 6,444,157 B1 * | 9/2002 | Miyajima ..................... 264/511 |
| 6,478,562 B1 * | 11/2002 | Miyajima ..................... 425/89 |
| 2004/0188697 A1 * | 9/2004 | Brunner et al. ............... 257/99 |

FOREIGN PATENT DOCUMENTS

| JP | A-61-36940 | 2/1986 |
| JP | A 6-275767 | 9/1994 |
| JP | A 8-111465 | 4/1996 |
| JP | A 8-330342 | 12/1996 |
| JP | A 9-187831 | 7/1997 |
| JP | A 2001-341155 | 12/2001 |
| JP | A 2004-296962 | 10/2004 |

* cited by examiner

*Primary Examiner*—W. David Coleman
(74) *Attorney, Agent, or Firm*—Oliff & Berridge, PLC

(57) ABSTRACT

The present invention is characterized in that a powdery or granular resin composition stirred and melted in an agitating pot having a heater by rotating an agitating rod projecting from a tip of an agitating plunger, the agitated and melted resin composition is taken out and formed in the form of a package under pressure, and the formed resin composition is fitted to a compression plunger inside a cavity of a lower molding unit, a semiconductor package is molded by encapsulating under pressurizing with the compression plunger.

Even when the wires are thinned and arranged at a higher density, the above producing method can provide such method and apparatus for producing the resin-encapsulated type semiconductor packages that produce less flowing of the wires.

15 Claims, 9 Drawing Sheets

RESIN-ENCAPSULATED TYPE SEMICONDUCTOR PACKAGES, AND PRODUCTION METHOD AND APPARATUS THEREFOR

BACKGROUND

1. Technical Field

The present invention relates to resin-encapsulated type semiconductor packages and production method and apparatus therefor. For example, the invention is favorably used as a method for producing resin-encapsulated type semiconductor packages by encapsulating transistors, semiconductor chips such as IC and LSI, electronic parts, etc. with resin compositions.

2. Prior Art

Heretofore, a transfer molding has been widely used as a known method suitable for encapsulating transistors, semiconductor chips such as IC and LSI, other electronic parts, etc. with epoxy resin encapsulating materials suitably from the standpoint of low costs as well as high reliability and productivity. This is shown in FIG. 15.

According to this transfer molding, the following is a common method. That is, the epoxy resin encapsulating material is preliminarily formed as a tablet, and the tablet 72 is placed in a pot 62 of a molding die 61, and pressed with a feeding plunger while being melted under heating. Thereby, the melt is fed into a molding cavity 63 via various flow paths including a transfer pot, a runner 64 and a gate 65. The epoxy resin encapsulating material is formed and cured and simultaneously a semiconductor package is molded by encapsulating a lead frame 63a to which semiconductor chips or electronic parts are attached.

However, this method is based on the assumption that the epoxy resin encapsulating material is preliminarily formed in the form of the tablet, and therefore additional forming step is necessary. Since such tablets differ depending upon shapes and sizes of products to be formed by molding. Thus, many tablet machines and molding dies are required for such tables. Further, there are problems that tablets are broken during transferring and fine powder attached to surfaces of the tablets scatter on surfaces of molding dies and deteriorate quality of the products.

Furthermore, according to the transfer molding method, most of the resin remaining in the transfer pot, the runner and the gate is disposed of as an unnecessary cured resin, so that there is a limit in increasing a resin efficiency as a ratio of the used encapsulating resin to the total one. Moreover, since tablets need to be stored in different sizes depending upon those of products, it is troublesome to effect inventory control for the tablets. Thus, there is a problem from the standpoint of effective utilization of resources as well as cost performance.

To the contrary, a compression molding method is proposed in which a resin-encapsulating molding die composed of upper and lower split molding dies is maintained at a given high temperature, a thermosetting resin is applied inside the molding die and melted there, a lead frame or a TAB tape having semiconductor chips mounted thereon is fixed in the molding die, and a package is formed by applying pressure upon the molding die. See Patent Document 1, for example.

Another compression molding method is proposed in which an encapsulating resin sheet composed of a non-cured resin is arranged at least on an activating face of semiconductor chips connected to an outside lead-constructing body via bonding wires, and a package is formed by pressing the encapsulating resin sheet upon the semiconductor chips. See Patent Document 2, for example.

Further, a further compression molding method is proposed in which a lead frame or a tape frame having semiconductor chips mounted thereon is inserted into a molding die, a sheet-shaped resin is fed directly into a cavity, and a package is formed under pressure in the state that bottom faces of upper and lower cavities are acting as forming plungers. See Patent Document 3, for example.

A still further compression molding method is proposed in which semiconductor chips provided on a carrier are placed together with a thin plate-shaped resin chip in a molding die composed of upper and lower molding units one of which is opened and closed relative to the other, and a package is formed by pressing the resin chip upon the semiconductor chips. See Patent Document 4, for example.

These four Patent Documents 1 to 4 propose that the compression molding methods can be utilized as semiconductor-sealed body-producing method to cope with requirements that the encapsulating step can be automated in an inline system and suited for enlarged scales, reduced thicknesses, and high integration of packages with high reliability.

However, since the applied resin, the resin sheet or the resin chip is preliminarily heated on the molding die at a high temperature of around 170° C. for a given time period and then subjected to compression molding, there exists a problem that metal wires are deformed due to increase in viscosity with progress in curing of the encapsulating resin. Further, as to the transfer molding, there are problems that apparatuses for producing the tablets, the resin sheets or the resin chips are needed and resulting tablets, resin sheets or resin chips are required to be stored.

Patent Document 1: JP-A 8-111465 (page 2 to 5)
Patent Document 2: JP-A 6-275767 (pages 2 to 9)
Patent Document 3: JP-A 8-330342 (Pages 2 to 6)
Patent Document 4: JP-A 9-187831 (pages 2 to 10)

SUMMARY

The present invention has been made to solve the problems that when semiconductor packages become larger, more thinned and more highly integrated, the wires are more likely to be flown and high reliability is difficult to be attained. The invention is aimed at the provision of a method and an apparatus for producing a resin-encapsulated type semiconductor package in which the wires are difficult to be flown even when semiconductor packages become larger, more thinned and more highly integrated.

Further, the present invention is aimed at the provision of a method and an apparatus for producing a resin-encapsulated type semiconductor package, while enabling increased productivity and effective utilization of the resin with a reduced waste amount of the resin by omitting the conventional resin tablets and effecting a forming step in an inline process.

The present invention is directed to the following methods <1> to <7>:

<1> a resin-encapsulated type semiconductor package-producing method comprising (1) feeding a powdery or granular resin composition into a weighing pot and weighing the resin composition, (2) feeding the resin composition from the weighing pot to an agitating pot having a heater, (3) agitating and melting the resin composition in the agitating pot, (4) taking out the agitated and melted resin composition and forming it in the form of a package under pressure, (5) fitting a lead frame or a tape substrate on which semiconductor chips or electronic parts are attached to a cavity of an upper molding die unit of a molding die having a heater, (6) fitting the formed resin composition to a compression plunger inside a cavity of a lower molding unit, (7) after clamping the molding die, obtaining an integrally molded body by encapsulating the semiconductor chips or electronic parts and the lead frame or tape substrate through pressing the resin composition with the compression plunger and molding and curing the resin composition, and (8) taking out the integrally molded semiconductor package from the molding die.

<2> In the above step (3) of <1>, temperature of the agitating pot having the heater is in a range of 80° C. to 120° C. when the resin composition is melted under agitating.

<3> In the above step (3) of <1> or <2>, the time for melting the resin composition under agitating is in a range of 10 to 50 seconds.

<4> In the above step (4) of any one of <1> to <3>, the temperature of the molding die is in a range of 500 to 100° C. with a pressing pressure (forming pressure) of 9.8 KN to 39.2 KN when the resin composition is pressed and formed.

<5> In the above step (4) of any one of <1> to <4>, the formed resin composition has a shape which is substantially similar to an outer shape of a molding bottom face of the lower cavity and smaller than this outer shape of the cavity of the lower molding unit by a range of 0.1 to 0.5 mm.

<6> In the step (4) of any one of <1> to <4>, an area of one face of the formed composition is not less than 90% of that of a molding bottom face of the cavity of the lower molding unit.

<7> The resin-encapsulated type semiconductor package obtained by any one of <1> to <6> is diced within a frames defined by an uneven line formed at a bottom face thereof along an outer shape of the end face of the compression plunger.

<8> A resin composition-encapsulated type semiconductor package-producing apparatus comprises (1) a weighing unit for feeding a powdery or granular resin composition into a weighing pot and weighing it, (2) a resin feeder for feeding the resin composition from the weighing pot into an agitating pot having a heater, (3) an agitating/melting unit for agitating and melting the resin composition in the agitating pot by rotating an agitating rod projecting from a tip of an agitating plunger, (4) a forming unit for taking out the agitated and melted resin composition and forming it in the form of a package under pressure, (5) a device for attaching an object to be sealed, said device being adapted for attaching a lead frame or a tape substrate on which semiconductor chips or electronic parts are attached to a cavity of an upper molding unit of a molding die having a heater, (6) a encapsulating resin-fitting device for fitting the formed resin composition to a compression plunger inside a cavity of a lower molding unit, (7) a encapsulating device for obtaining an integrally molded body, after clamping the molding die, by encapsulating the semiconductor chips or electronic parts and the lead frame or tape substrate through pressing the resin composition with the compression plunger and molding and curing the resin composition, and (8) a takeout device for taking out the resulting semiconductor package from the molding die.

<9> A resin-encapsulated type semiconductor package is produced by any of the producing methods<1> to <7> or the apparatus in <8>.

The producing method and apparatus of the present invention are suitable for producing the resin-encapsulated type semiconductor package which becomes large, thinned and highly integrated, since the wires are difficult to be flown even in case that the wires are thinned and highly dense.

Further, according to the producing method and apparatus of the present invention, since the transfer pot, the runner and the gate are omitted, the use amount of the resin and the amount of the waste resin can be not only reduced, but also the molding die can be made compact. Further, since the resin fed into the molding die is melted under agitating, the resin needs not be preliminarily heated inside the molding die, so that the curing time can be shortened and the productivity can be enhanced.

Furthermore, according to the producing method and apparatus of the present invention, the encapsulating resin to be fed in the agitating step may be powdery or granular. Since the resin needs not be any of a tablet, a resin sheet or resin chips, a forming step is unnecessary for preliminarily treating the sealing resin. Further, it is possible to obtain practical effects that a troublesome inventory control is unnecessary unlike the case of using the resin tables, the resin sheets or the resin chips.

DETAILED DESCRIPTION OF EMBODIMENTS

Figure 1:
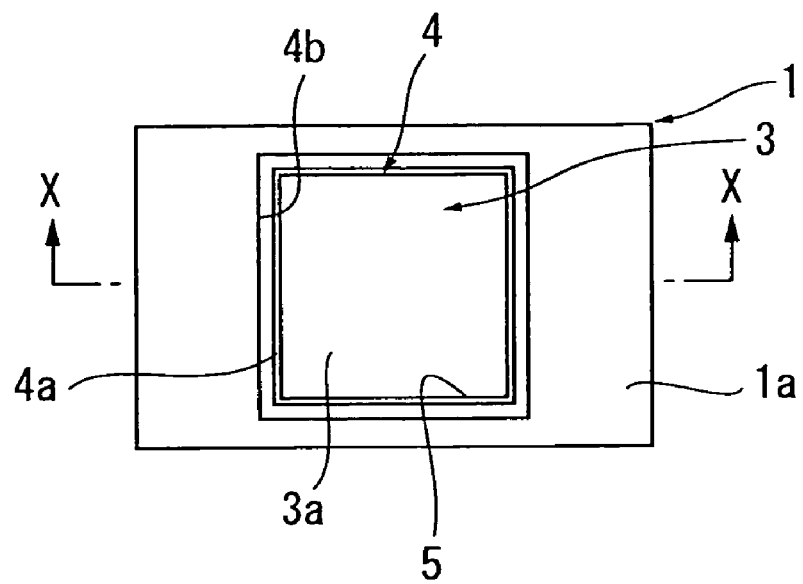
FIG. 1 is a plane view showing a principal portion of a lower molding unit of a encapsulating/molding apparatus according to an embodiment of the present invention.

Best Mode for Carrying Out the Invention

In the following, specific embodiments for carrying out the present invention will be explained with reference to the drawings. Illustration will be made, while same reference numerals are given to sites and members which are identical with or equivalent to those in the conventional apparatus illustrated.

Regarding the present invention, an invention "apparatus and method for feeding a resin material" as described in JP-A 2001-341155 may be used as a preferred embodiment of the forming method and apparatus in which wires are more difficult to be flown as compared with the conventional transfer molding method and the conventional compression molding method in which the resin sheet is fed.

A resin material feeder shown in this unexamined patent publication comprises a weighing unit for feeding the resin into a weighing pot and weighing it, a transfer unit for transferring the resin material from the weighing unit to an agitating pot having a heater, an agitating/melting unit for agitating and melting the resin material in the agitating pot by rotating an agitating rod projecting from a tip of an agitating plunger, and a feeding unit for extruding the agitated and melted resin material toward a molding pot of a molding die.

Figure 2:
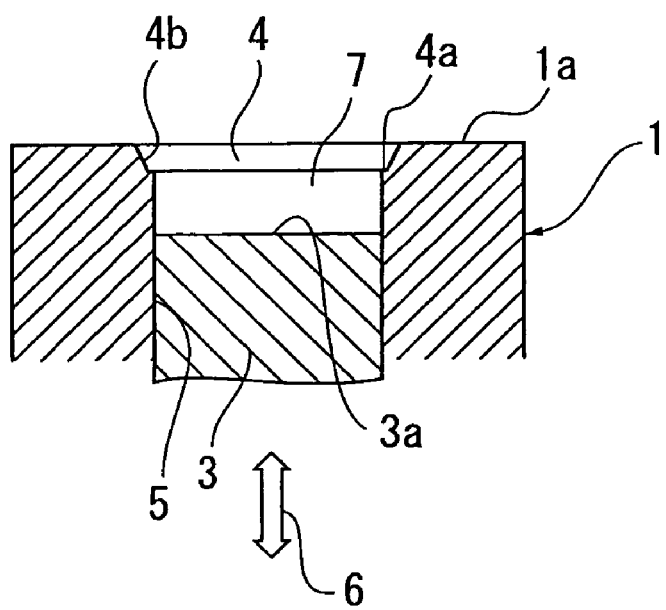
FIG. 2 is a sectional view of the lower molding unit of FIG. 1 cut along an X-X line.

As shown in FIGS. 1 and 2, the present invention uses an encapsulating apparatus (compression molding apparatus) in which a tip face 3a of a plunger is taken as a forming face in the present invention instead of the above pot of the molding die and a compression molding is utilized with a resin-receiving section 7 provided above the tip face 3a.

Further, according to the present invention, an inloader is provided, which feeds the resin composition heated and agitated in the feeding unit to the resin-receiving section 7 after the resin composition is pressed and formed in a package form with a forming unit assembled into the producing apparatus as mentioned above. After the thus formed resin composition is led into the resin-receiving section 7 from the inloader, the encapsulating device (compression molding apparatus) is clamped and object to be encapsulated is encapsulated with the resin composition during being heated and cured by raising the compression plunger 3 to a given position. Such resin-encapsulated type semiconductor package-producing method and apparatus can afford an effect that the wires are more difficult to be flown as compared with the conventional transfer molding method and the conventional compression molding method in which the resin sheet or the resin chips is fed.

In the following, the resin-encapsulated type semiconductor package-producing method and apparatus will be described in detail, which can perform the compression molding by feeding the resin composition formed in the package shape after being agitated into the encapsulating apparatus (compression molding apparatus) in connection with the above resin material-feeding apparatus and method.

Figure 4:
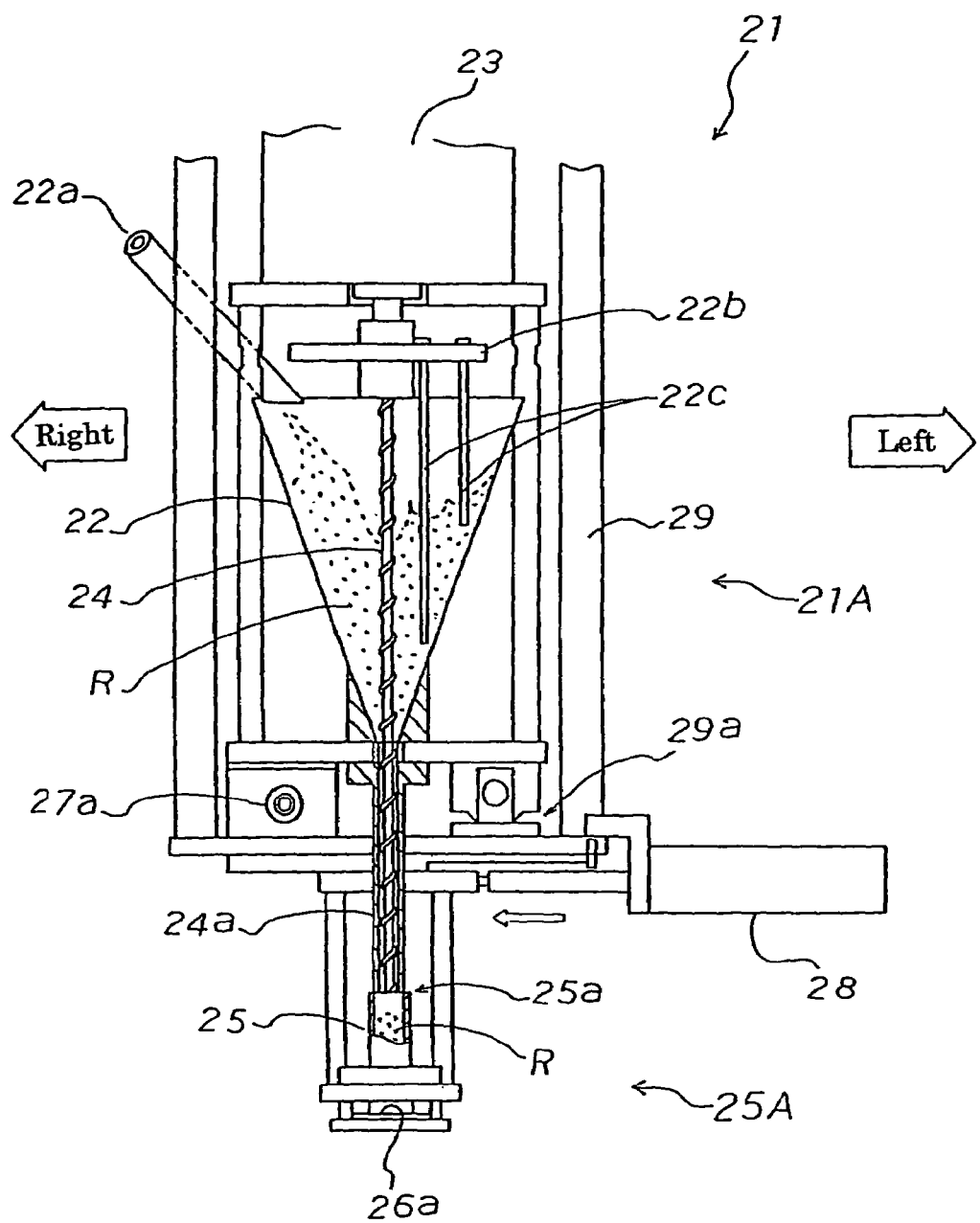
FIG. 4 is a view of FIG. 3 as viewed in an arrow direction of A.
Figure 5:
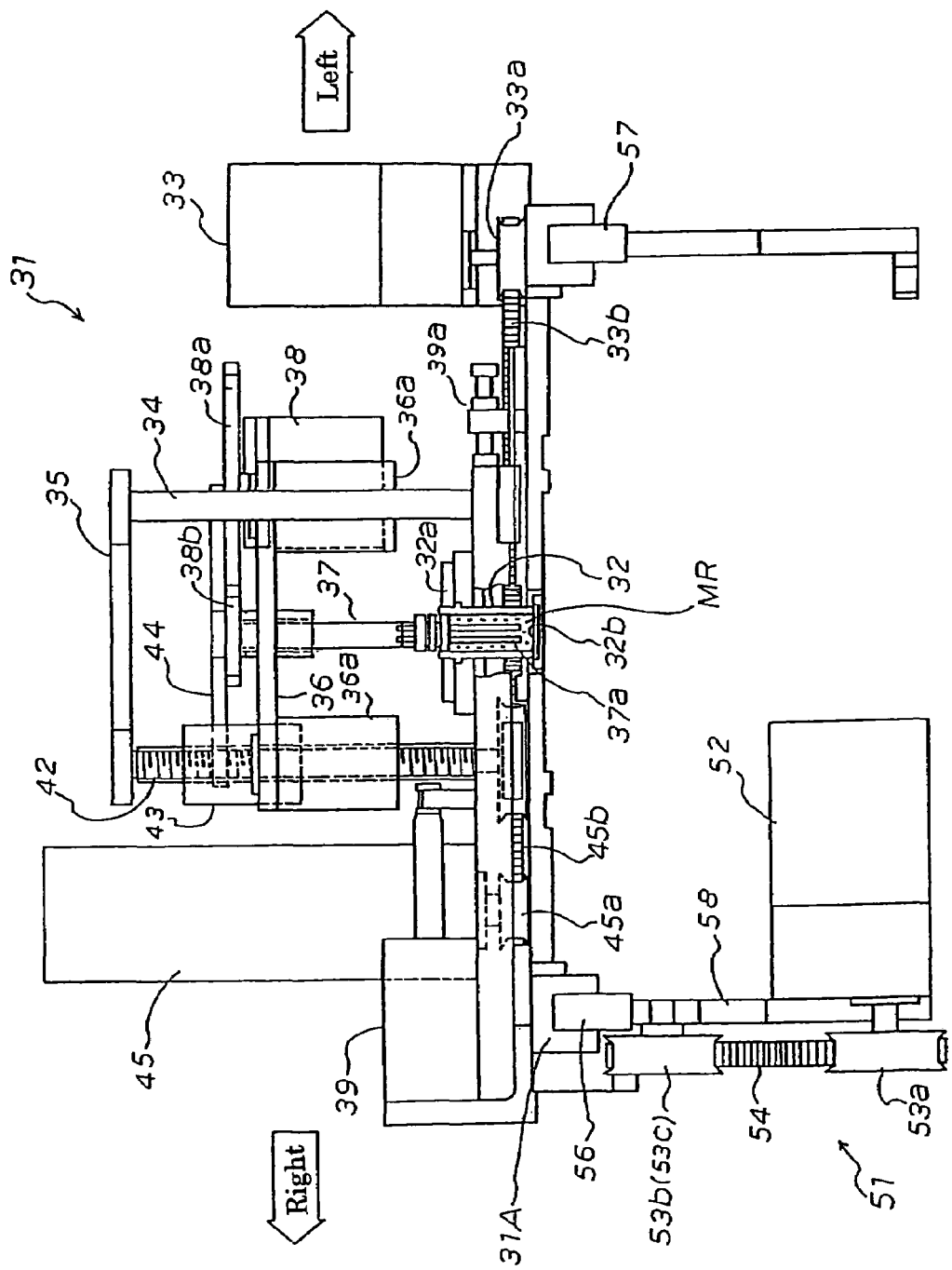
FIG. 5 is a view of FIG. 3 as viewed in an arrow direction of B.
Figure 6:
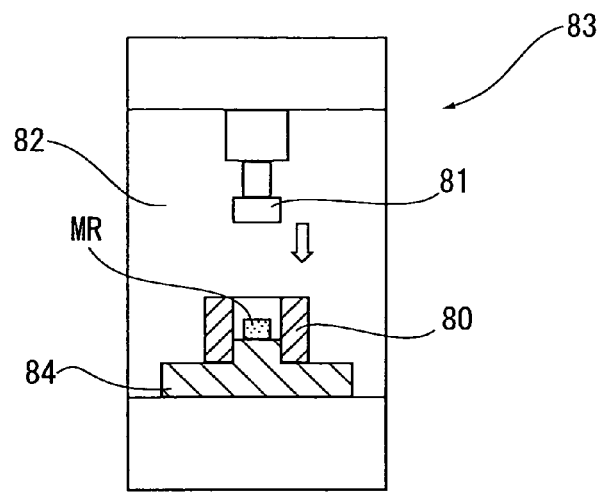
FIG. 6 is a front view showing a principal portion in forming with the encapsulating/molding apparatus according to the embodiment of the present invention.

As shown in FIG. 3 to FIG. 6, the resin-encapsulated type semiconductor package-producing apparatus according to the present invention comprises a encapsulating/molding apparatus 20 which is equipped with a feeder for a powdery or granular resin composition R (hereinafter referred to as "powdery resin R") and is roughly composed of a weighing unit (FIG. 4), an agitating unit (FIG. 5) and a forming unit (FIG. 6).

The weighing unit 21 leads the powdery resin R stored in a hopper 22 into a weighing tube 24a under rotation of a screw 24, and the powdery resin is measured by rotating the screw 24 inside the weighing tube 24a. Thereby, the power is successively charged into plural weighing pots 25 arranged.

The agitating unit 31 shown in FIG. 5 transfers the measured powdery resin R between the weighing pot 25 and an agitating pot 32 having a heater. Into the agitating pot 32 is fitted a plunger 37 having agitating rods 37a projecting from its tip, and the resin is agitated and melted under rotation of the plunger 37.

The forming unit 83 shown in FIG. 6 takes out the agitated and melted resin composition MR (hereinafter referred to as "melted resin MR") and feeds it into a forming receptacle 80, and the resin composition MR is formed in a package shape by pressing it with an oil hydraulic press 82 via a plunger 81.

The outer shape of an encapsulated portion of the resin-sealed type semiconductor is restricted to the shape of a side face 4b of a cavity-molding section (molding section) 4. In the present invention, the shape of the inner peripheral face of the forming receptacle 80 is designed substantially identical with the outer shape of the encapsulated portion of the resin-encapsulated type semiconductor package. "Substantially identical with" in shape means that the outer shape of the formed resin composition (hereinafter referred to as "formed resin FR") is substantially identical with that of the encapsulated portion of the resin-encapsulated type semiconductor package. In the present invention, the flowing of the wires is suppressed by reducing the flowing of the resin in a plane direction as much as possible during the encapsulating step through making the outer shape of the formed resin FR substantially identical with the encapsulated shape of the encapsulated portion of the resin-encapsulated type semiconductor package.

Figure 8:
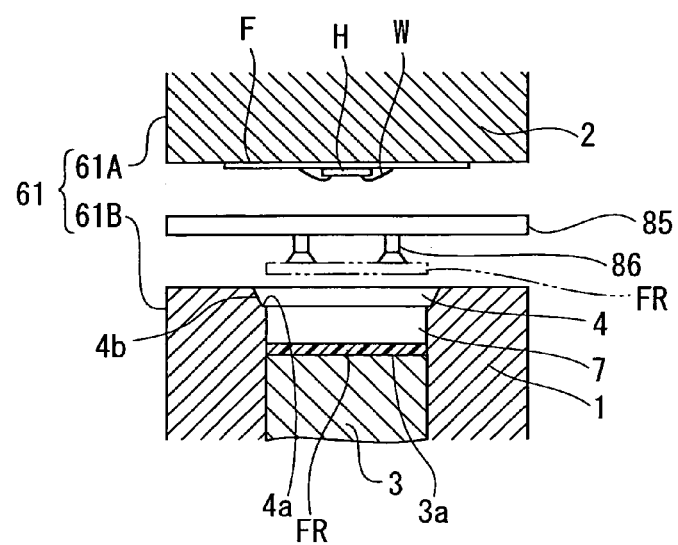
FIG. 8 is a schematic view for illustrating a fitting step of the formed resin as one step in encapsulating with the encapsulating/molding apparatus according to the embodiment of the present invention.

A transfer unit 85 shown in FIG. 8 transfers the resin composition FR formed by the inloader assembled into the producing apparatus toward a molding die 61, and feeds the formed resin FR into a resin-receiving section 7. A lower molding cavity block 1 is exchangeably set in a lower molding unit 61B. When the formed resin FR is carried to above the resin-receiving section 7 of the cavity block 1 of the lower molding unit by the transfer unit 85, adsorption of a adsorbing pads 86 fitted to the transfer unit 85 are stopped to feed the shaped resin FR to the resin-receiving section 7.

FIG. 1 is a plane view for illustrating the lower molding cavity block 1, and FIG. 2 is a sectional view of FIG. 1 cut along an X-X line. In these figures, a cavity forming section (molding section) 4 is provided as a product-molding section) in a central portion of the lower molding cavity block 1. A bottom face 4a of the molding section 4 is cut in an almost central portion as a through-hole section 5 in the form of a rectangular column, and a compression plunger 3 is vertically movably fitted in the through-hole section 5.

A tip face 3a of the compression plunger 3 is designed to have a shape substantially similar to the outer shape of a surface Pa of the encapsulated portion of the resin-encapsulated type semiconductor package as a product. Herein, "substantially similar shape" includes a similar shape as well as an improved design in which a curvature (rounded portion) is provided at a corner portion, for example. In this case, when the tip face 3*a* of the compression plunger 3 is at the same level with the bottom face 4*a*, the lower cavity portion is equal to the molding section 4.

The compression plunger 3 is movable to-and-fro by a reciprocal mechanism 6. Although this reciprocal mechanism 6 is not particularly limited, a mechanism of which forward and rearward moving amounts can be accurately controlled with a servo motor, an encoder or the like is preferred.

The reciprocal mechanism 6 for the compression molding means that the reciprocating mechanism 6 can maintain force necessary for compression molding. When pressure needs to be controlled, a mechanism for controlling the molding pressure via a pressure detector such as a pressure sensor has only to be provided at any location. Such pressure controlling mechanism is known, and a pressure detector such as the load cell may be interposed between the compression plunger 3 and the reciprocal mechanism 6 to maintain the necessary pressure based on the pressure detected by the pressure detector.

When the position of the tip face 3*a* of the compression plunger 3 is retracted from the position (hereinafter referred to as "molding die-aligning position") of the lower face 4*a* of the molding section 4, the resin-receiving section 7 for receiving the resin is formed above this tip face 3*a*. For example, in FIG. 2, the compression plunger 3 is retracted to form the resin-receiving section 7 above the tip face 3*a* so that the formed resin FR after being agitated and melted may be fed therein.

(1) Weighing Step

The weighing step is a step by which a powdery resin R fed into the hopper 22 is fed into the weighing pot 25 by the weighing unit 21.

As shown in FIG. 4, the powdery resin R fed into the hopper 22 through a resin composition feeding port 22*a* is loosened inside the hopper 22 with loosing pins 22*c* hanged from a rotary disc 22*b* similarly rotating around a screw 24 rotated by a weighing motor 23 without forming bridge, so that the powder may be easily bit around the screw 24, and sufficiently and quantitatively fed. When the screw 24 is rotated inside the weighing tube 24*a* at given rpm, a given amount of the powdery resin R is measured, and fed to the weighing pot 25 of the pot 25A from the weighing section 21A.

Figure 3:
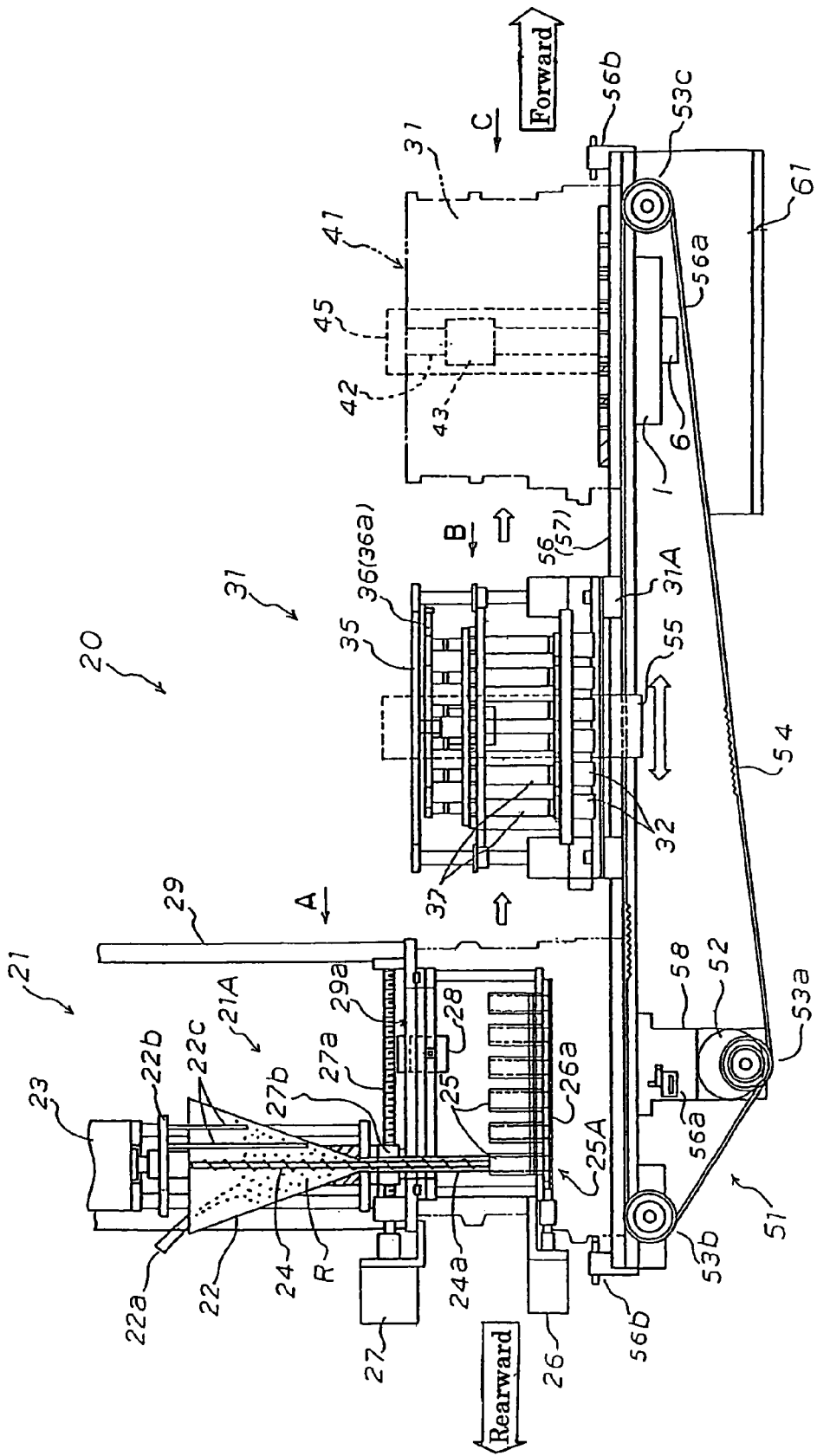
FIG. 3 is a schematic side view for illustrating the encapsulating/molding apparatus.

The feeding motor 27 is operated to move the weighing section 21A within the frame body 29 along above the upper end faces of the weighing pots, so that the powdery resin R is charged into all the weighing pots 25 (See FIGS. 3 and 4).

In the present invention, the method and the apparatus for weighing the powdery resin R are not particularly limited to those using the above weighing unit 21, and any method and apparatus may be used so long as the powdery resin R can be measured into the weighing pots 25 with given accuracy. For example, a quantitative feeder such as a weighing feeder or a spiral feeder commonly employed can be used.

(2) Resin Transfer Step

The resin transfer step is a step in which the powdery resin R is fed into the agitating pot having a heater from the weighing pot 25.

In this step, as shown in FIGS. 3 and 5, when the powdery resin R is charged into each of the weighing pots 25 in the above weighing step, the pot-moving cylinder 28 is operated to move the pot section 25A, and the pot-moving cylinder 33 is operated to accept the agitating pot 32. Then, an on/off cylinder 26 is operated under the weighing pot 25 to open a shutter plate 26*a*, so that the measured powdery resin R is led from the weighing pot 25 to the agitating pot 32. Successively, the pot-moving motor 33 is moved to an original position, and the agitating pot 32 is located under the plunger 37.

(3) Agitating/Melting Step

The agitating/melting step is a step in which the powdery resin R is melted in the agitating pot by rotating the agitating rods projected from the tip of the agitating plunger and the melted resin MR is taken out.

In this step, a cylinder 36*a* for the agitating rod is operated to project the agitating rods 37*a* from the tip of the plunger 37, and successively the agitating motor 38 to which a gear 38*a* is fitted is so operated as shown in FIG. 5 that the plunger 37 is rotated to stir and melt the powdery resin R inside the agitating pot 32 having the heater.

While the agitating unit 31 is agitating the resin, the moving motor 52 fixed to a rail 56 of the moving unit 51 via a stay 58 is rapidly operated to drive a timing belt 54 so that the agitating unit may be moved, on the rails 56 and 57 to a position to which a limit switch 56*a* acts.

After agitating and melting the resin, the agitating rod cylinder 36*a* is operated to raise a movable plate 44 and put the agitating rods 37*a* into the cylinder 37.

Then, the vertically moving motor 45 is operated to rotate a ball screw 42 via a pulley 45*a* axially attached to the motor and a belt 45, and each plunger 37 fitted to a descending ball screw nut 43 via a lower connection plate 36 is lowered at one stroke to take out the molten resin MR agitated and melted in the agitating pot 32.

In the agitating/melting step of the present invention, the temperature of the agitating pot having the heater is preferably in a range of 80° C. to 120° C. Although depending upon the kind and the characteristics of the encapsulating resin used, the temperature is preferably in a range of 90° C. to 110° C. If the temperature of the agitating pot is not more than 80° C., there may be problems that the powdery or granular resin is not fully melted and non-melted resin precipitates to disable a given weight of the resin to be fed, and the curing time cannot be shortened due to the lower resin temperature. Accordingly, there occurs a problem that the resulting encapsulated product contains much voids due to these defects. On the other hand, if the temperature is not less than 120° C., it may be that the curing is promoted due to too high temperature to accelerate the gelation of the resin. This causes increased viscosity, lowered flowability and deteriorated thermal stability. As a result, the encapsulated product suffers from insufficient resin-charging, numerous voids, quality problems such as wire deformation and breakage in the encapsulated molded product as well as damaged continuous moldability.

Further, the agitating/melting time is preferably in a range of 10 to 50 seconds in the agitating/melting step of the present invention. Although associated with the temperature of the agitating pot, the agitating/melting time is preferably in a range of 20 to 40 seconds.

If the agitating/melting time is shorter than 10 second, the powdery resin R is not fully melted, so that the rotary torque of the agitating rod needs to be increased. Thus, the capacity of the agitating motor needs to be increased, which prevents the entire apparatus from being made compact. Further, the same problems as in the case of the lower pot temperature occurs with respect to the productivity and quality. On the other hand, if the agitating/melting time is longer than 50 seconds, it may be that the thermal stability of the molten resin is deteriorated and curing is promoted to accelerate the gelation, although the agitated/melted state is good and the curing time can be shortened. Consequently, the encapsulated product suffers from insufficient resin-charging, numerous voids, quality problems such as wire deformation and breakage in the encapsulated molded product as well as damaged continuous moldability.

(4) Forming Step

The forming step is a step in which the molten resin MR is taken out and formed in a package shape under pressure, thereby obtain a formed resin.

Figure 7:
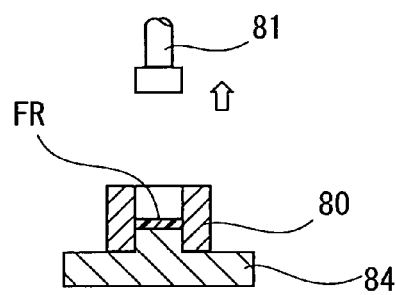
FIG. 7 is a schematic view for illustrating the state a formed resin FR as one step in forming with the encapsulating/molding apparatus according to the embodiment of the present invention.

In this step, the molten resin MR agitated and melted in the agitating pot 32 is taken out, and as shown in FIGS. 6 and 7, is fed to the receiving table 84 with the forming receptacle 81 and the heater, and formed into a semiconductor package under pressure by the plunger 81 connected to the oil hydraulic press 82. Thereby, the formed resin FR is obtained.

In the forming step of the present invention, the temperature of the receiving table having the heater is preferably in a range of 50° C. to 100° C. when the resin is formed under pressure. Although depending upon the kind and the characteristics of the sealing resin used, the temperature is preferably in a range of 60° C. to 90° C. If the conventional tablet or powdery or granular resin composition is used, such is difficult to be softened and formed in this temperature range. However, since the molten resin composition MR is already present in the agitating pot 32 by agitating and melting, the resin composition can be formed. If the forming temperature is less than this range, the formed resin FR can not be obtained in the package shape due to occurrence of thickness spots and density spots in the formed resin FR, although depending upon the pressure mentioned later. As a result, the resin cannot be uniformly compressed during compression molding mentioned later, so that the wires are partially flown or many voids are formed. On the other hand, if the forming temperature is higher than the above temperature range, it may be that burrs are formed in gaps among the plunger 81, the forming receptacle 80 and the receiving table 84 and a given weight of the formed resin FR may not be obtained. As the case may be, the resin vigorously attaches to the plunger 81 and the receiving table 84, so that it is difficult to clean them, resulting in damaging the continuous moldability.

In the forming step of the present invention, the pressurizing force (forming pressure) is preferably in a range of 9.8 KN to 39.2 KN. Although depending upon the kind and the characteristics of the encapsulating resin used, the forming pressure is preferably 19.6 KN to 29.4 KN. If the forming pressure is in such a range, the ordinary powdery or granular resin can hardly be formed. According to the present invention, since the molten resin MR already agitated and melted in the agitating pot 32 is received directly in the forming step, it can be formed under such a low forming pressure.

If the forming pressure is lower than the lower limit, it may become difficult to form the resin in a package shape, and a large non-charged state may occur particularly in a corner portion. Although the resin can be formed in the package shape by raising the forming temperature, the raised forming temperature may generate the above-mentioned problems. On the other hand, if the forming pressure exceeds the upper limit, the pressurizing force with the oil hydraulic press needs be raised, which hinders compacting of the apparatus.

The package shape in the present invention means the encapsulated shape of the encapsulated portion of the resin-encapsulated type semiconductor package restrained by the shape of the cavity-forming section (molding section) 4. In the present invention, the outer shape of the formed resin FR is preferably substantially identical with the encapsulated shape of the encapsulated portion of the resin-encapsulated type semiconductor package of products.

The formed resin FR can be fitted into the resin-receiving section 7. In practice, considering the above fitting the FR to the resin-receiving section, the outer shape of the formed resin FR needs to be designed slightly smaller than that of the tip face 3*a* of the forming plunger. Accordingly, "substantially identical with the outer shape of the package" means, for example, that the outer shape of the formed resin FR is smaller than that of the encapsulated portion of the resin-encapsulated type semiconductor package by a range of 0.1 to 0.5 mm, provided that both are designed similar to each other or that the area of one face of the formed resin FR is not less than 90% of that of the surface 3*a*' of the encapsulated portion.

(5) Frame-Fitting Step

The frame-fitting step is a step in which a object to be encapsulated, such as a lead frame or tape substrate F on which semiconductor chips H (or electronic parts) are mounted is fitted in an upper molding cavity of the molding die having the heater.

In this step, as shown in FIG. 8, the tape substrate F (or the lead frame) as the aimed object is fitted onto a surface of the upper molding cavity block 2 attached to the upper molding unit 61A via an inloader (not shown) for integration, arraying and discharging of the tape substrate (or the lead frame 63*a*) on which the semiconductor chips H (or the electronic parts) are attached. At that time, a holder for the tape substrate F (or the lead frame 63*a*) is not particularly limited, and vacuum suction or mechanical set not shown may be utilized, for example.

(6) Formed Resin-Fitting Step

The formed resin-fitting step is a step in which the formed resin FR is fitted to the compression plunger inside the lower molding cavity.

As shown in FIG. 8, according to this step, the transfer unit 85 moves the formed resin FR toward the molding die 61, and the absorption pads 86 attached to the transfer unit 85 are actuated to fit the formed resin FR to the resin-receiving section 7 at a point of time when the formed resin FR is located in the resin-receiving section of the lower molding cavity block 1 exchangeably set in the lower molding unit 61B.

(7) Compression Set:

The compression step is a step in which the semiconductor chips or the electronic parts and the tape substrate or the lead frame are integrated by encapsulatingly molding and curing the formed resin FR through pressurizing with the compression plunger after clamping the molding die.

Figure 9:
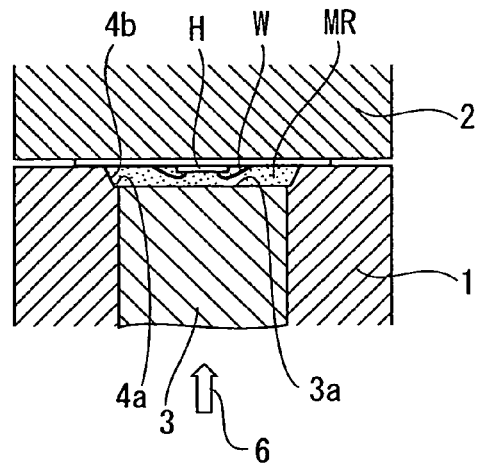
FIG. 9 is a schematic view for illustrating a compression forming step as one step in encapsulating with the encapsulating/molding apparatus according to the embodiment of the present invention.

According to this step, as shown in FIG. 9, after the molding die is closed by descending or ascending at least one of the upper molding cavity block 2 and the lower molding cavity block 1 with a molding die-clamping mechanism, the reciprocal mechanism is driven to raise (advance) the tip face 3*a* of the molding plunger 3 to a molding die-aligning position (molding face) and perform the compression molding.

According to the compression molding of the present invention, since the formed resin FR fed to the resin-receiving section 7 is appropriately preheated immediately after being formed by pressurizing under heating, the formed resin can obtain at once flowing ability optimum for the encapsulating immediately after being fed into the resin-receiving section 7.

In this embodiment, as shown in FIGS. 8 to 11, CSP in which the semiconductor chip H is held at one face of the tape substrate F and metallic wires W are connected thereto is used. Since encapsulating is effected from under the semiconductor chip to be encapsulated, the flowing distance of the molten resin flowing in the encapsulating member containing the metallic wires W can be shortened. In addition, since the formed resin FR is formed in the package shape, the flowing rate at which the formed resin FR is melted and flown can be retarded. Consequently, the flown degree of the wires can be reduced even in case of the metallic wires W at a finer pitch.

According to such a compression step, the molded face 3'a of the resulting semiconductor package (product) P (See FIG. 11) formed by the compression plunger 3 is formed with that mark 3ab' meeting the shape of the tip face 3a of the compression plunger 3 which goes up and down depending upon variations in weight of the formed resin FR.

Figure 10:
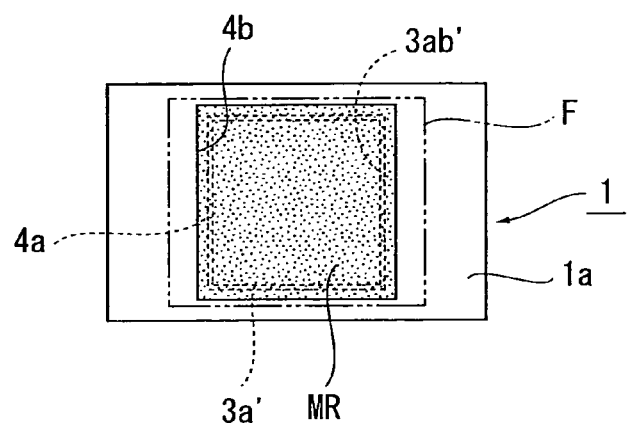
FIG. 10 is a schematic plane view of illustrating a state that the lower molding unit 1 is opened to illustrate the shape of the molded product obtained in FIG. 9.

Here, according to this embodiment, as shown in FIGS. 8 and 10, since the outer shape of the tip face 3a of the compression plunger 3 is designed slightly smaller than that of the bottom face 4a of the cavity 4 by a range of 0.1 mm to 0.5 mm, the uneven mark 3ab' does not substantially influence the performance of the product if the weight variations of the formed resin FR charged are appropriately controlled within a range of around ±0.1 g.

Further, in the case of packages such as package molding (usually called MAP) including CSP and BGA, since the molded product is diced into individual ones within frames of the uneven marks 3ab' after being removed from the molding die, no such an uneven mark 3ab' remains, so that no influence is substantially caused upon the shape and the performance of the product.

(8) Takeout Step

The takeout step is a step in which the semiconductor package as the integrally molded product is taken out from the molding die.

Figure 11:
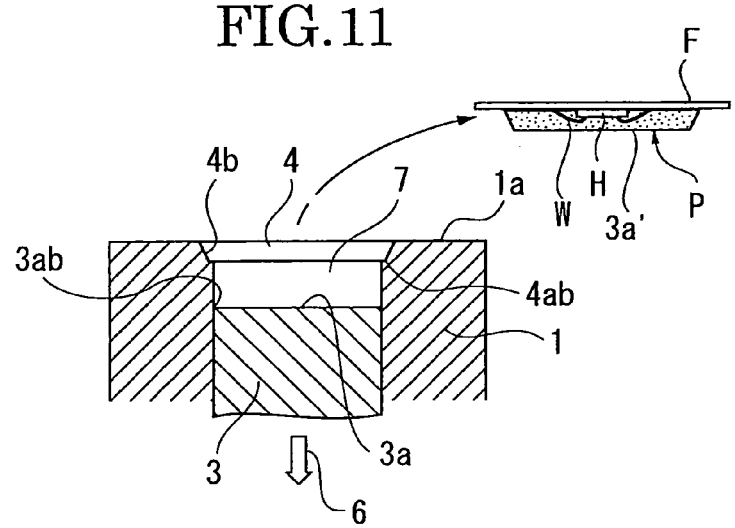
FIG. 11 is a schematic view of illustrating a takeout step as one step in encapsulating with the encapsulating/molding apparatus according the embodiment of the present invention.

In this step, the upper and lower molding units 61 are opened by the molding die-clamping mechanism after the resin is cured, and the product is taken out as the encapsulated molded product P by any means (See FIG. 11). Although the absorbing unit such as the absorbing pads is used to take out the product P, a thrust pin or thrust plate may be used for taking out it.

As shown in FIG. 11, the product P may be taken out by lowering (retracting) the compression plunger 3 with the reciprocating mechanism 6. By so doing, the product P can be taken out without a takeout device such as a projecting pin for taking out the product in the lower molding cavity block.

The resulting product P is sent to a succeeding step with an unloader or the like after being timely discharged and collected. Burrs, dirt and the like on split faces of the molding die are cleaned with a cleaner to prepare a next molding cycle.

According to the method and apparatus for producing the resin-encapsulated type semiconductor package in the present invention as explained above, the semiconductor package in which the wires are unlikely to flow even if the metallic wires are thinned at a higher density can be obtained.

Further, the resin tablet used in the multi-transfer molding can be made unnecessary, and enhanced productivity and effective utilization of the resin can be attained, while decreasing the amount of the resin waste. The gate-broken molded product can be obtained without passing a so-called gate break step by which the unnecessary resin remaining in the runner etc. is separated from the molded product.

Although effects of the present invention will be explained based on the following examples, the invention is not limited thereto.

EXAMPLE 1

An encapsulated molded product was produced by using a agitating pot at one site in the encapsulating molding method and apparatus shown in FIGS. 1 to 11. As an encapsulating resin, an epoxy resin molding material: SUMIKON "EME-7730" (Commercial name) manufactured by Sumitomo Bakelite Co., Ltd. was used.

Molding was actually effected under the molding condition that the temperature of the agitating pot 32 was 100° C., the agitating time was 30 seconds, the temperature of the forming receptacle 80 and the forming receiving table 84 was 80° C., the forming pressure was 24.5 KN, the injection pressure of the compression plunger 3 was 9 MPa, the injection time was 12 seconds, the curing time was 100 seconds, and the temperature of the molding die was at 175° C.

A molding die was used for molding 12 chips at one time in a package of 12 chips/1 frame. A tape substrate in which metallic wires were bonded to stacked chips consisting first-stage chips of 8 mm×6 mm and second-stage chips of 3.5 mm×3.5 mm with a charging thickness of 200 μm was set and molded in the molding die. With respect to the encapsulated molded product, non-charged state, outer voids, inner voids, wire flowing and resin waste rate were evaluated.

COMPARATIVE EXAMPLE 1

Figure 15:
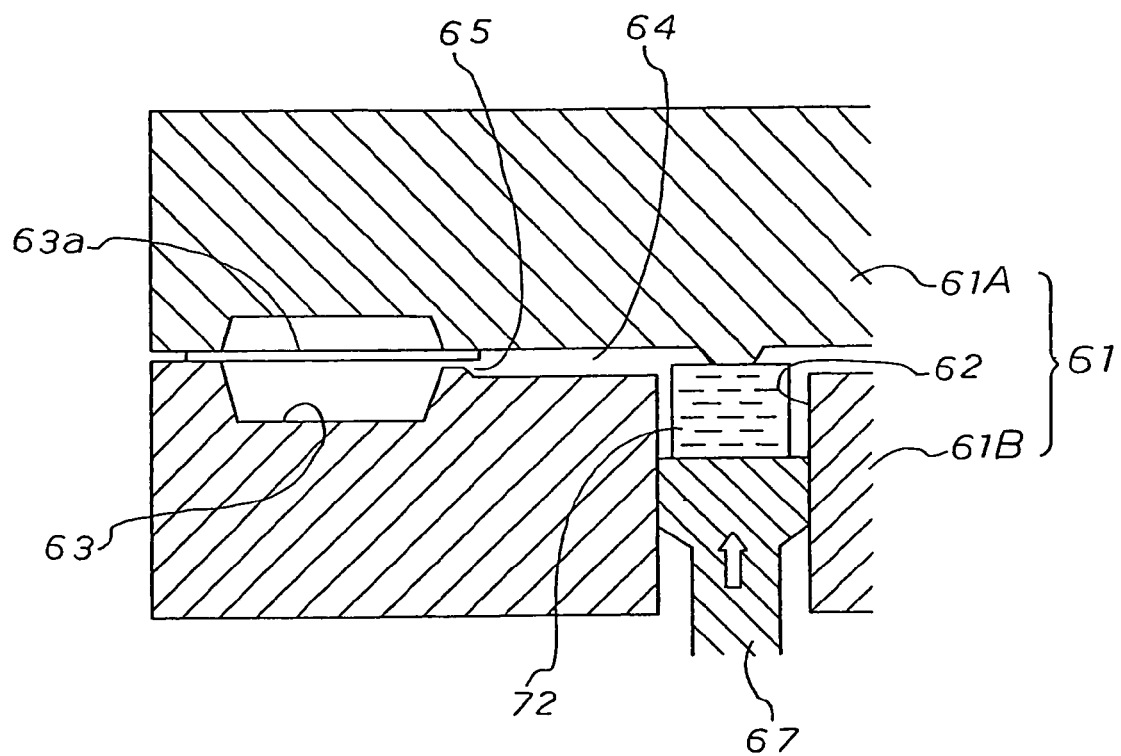
FIG. 15 is a schematic sectional view for illustrating a encapsulating step with the conventional encapsulating/molding apparatus.

As comparison, multi-transfer molding, which was carried out under the same molding condition except that a minitablet having a diameter of 14 mm was used in a molding apparatus as shown in FIG. 15, and the preheating time in the molding die was set at 4 seconds, was compared.

Results were shown together in Table 1.

TABLE 1

| Molding method | Example 1<br>Invention molding<br>method | Comparative Example 1<br>Multi-transfer<br>molding method |
| --- | --- | --- |
| Non-charged state | 0/3 | 0/3 |
| Outer voids | 0/3 | 0/3 |
| Inner voids | 0/3 | 0/3 |
| Wire sweeping | 2.6% | 16.6% |
| Resin waste rate | 3.7% | 75.7% |

(Measuring Methods)

1. Non-charged State (Short Shot)

Presence or absence of the non-charged state (Short shot) was visually observed at surface.

2. Outer Voids

Presence or absence of the outer voids greater than 0.5 mm in diameter at surface was observed by a binocular microscope (×10).

3. Inner Voids

Presence or absence of the inner voids greater than 0.3 mm in diameter was observed by irradiating soft X-rays upon the molded product.

With respect to numbers shown in Table 1, the denominator gives the number of packages observed which were each formed by molding 12-chip packages together, and the numerator gives the number of packages suffering abnormality.

4. Wire Sweeping (Wire Deformation)

A deformed amount of bonding wire (high strength metallic wire, 25 μm in diameter and 3.4 mm length) was measured by irradiating soft X-rays upon the molded product. The wire flowing was shown by a ratio (%) of a maximum deformed amount (%) of the wire to a distance in bonding between an end face of the semiconductor chip and an end of a tape lead. In Table 1, the figure shows the average value of maximum deformed amounts of 36 chips (evaluated three packages each containing 12 chips/one frame).

5. Resin Waste Rate

The resin waste rate was shown by a ratio (%) of a total resin amount included in the transfer pot, runner, gate, etc. to a necessary resin amount in the package of 12 chips/one frame.

EXAMPLE 2

Example 2 is an example to confirm influences upon performance of the molded product when the shape of the formed resin FR was changed.

As a molding die, a chip size package CPS for molding 12 chip/one frame (MAP) at one stroke was used, and a surface of a encapsulated portion was 38.70×38.35 mm. A chip size of each semiconductor device H is about 5 mm, and a bonding wire W is a high strength metallic wire of 25 μm diameter and 3.30 mm length.

Figure 12:
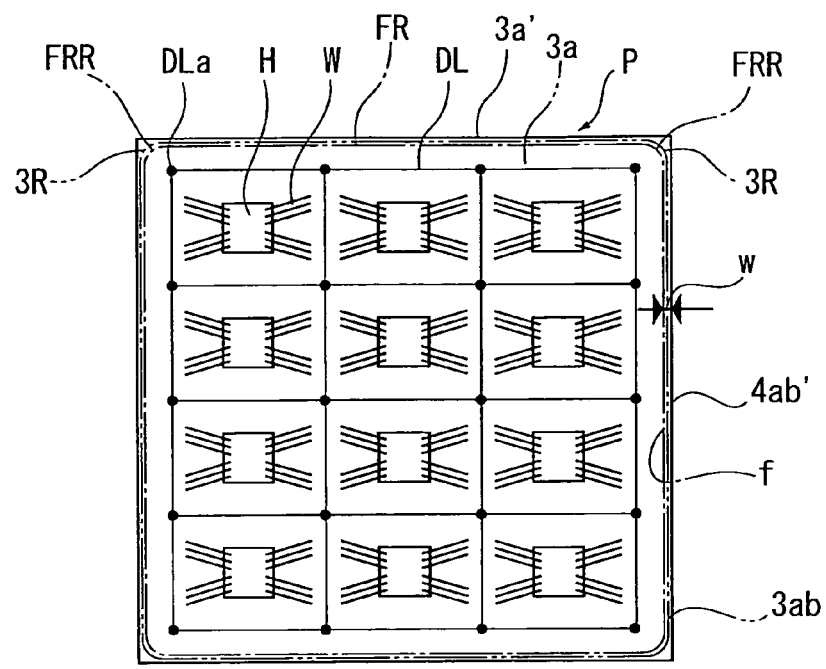
FIG. 12 is a view for illustrating the shape of a formed resin in the encapsulating/molding apparatus according to the embodiment of the present invention for comparison with the outer shape of the comparison formed resin FR.
Figure 13:
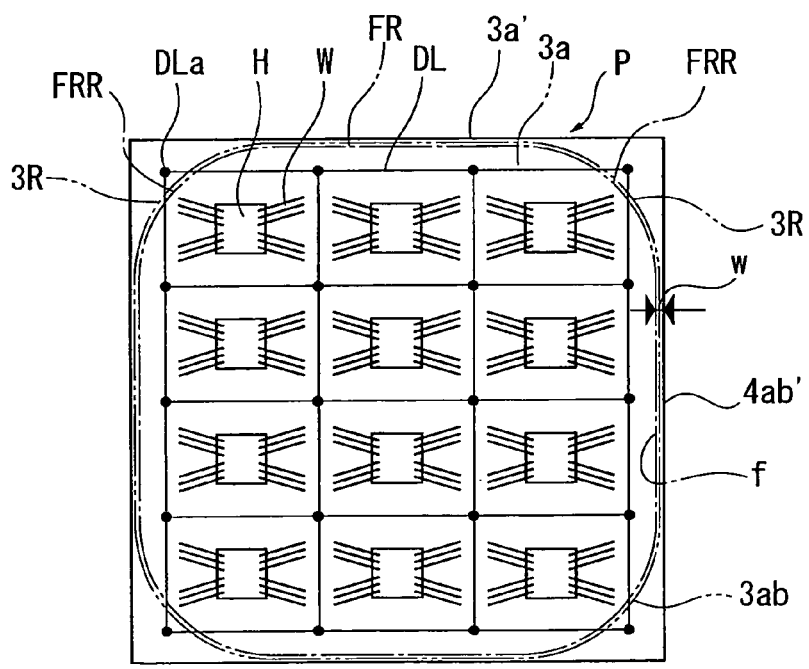
FIG. 13 is another schematic view for illustrating the outer shape of a formed resin in the encapsulating/molding apparatus according to the embodiment of the present invention for comparison with the outer shape of the comparison formed resin FR.
Figure 14:
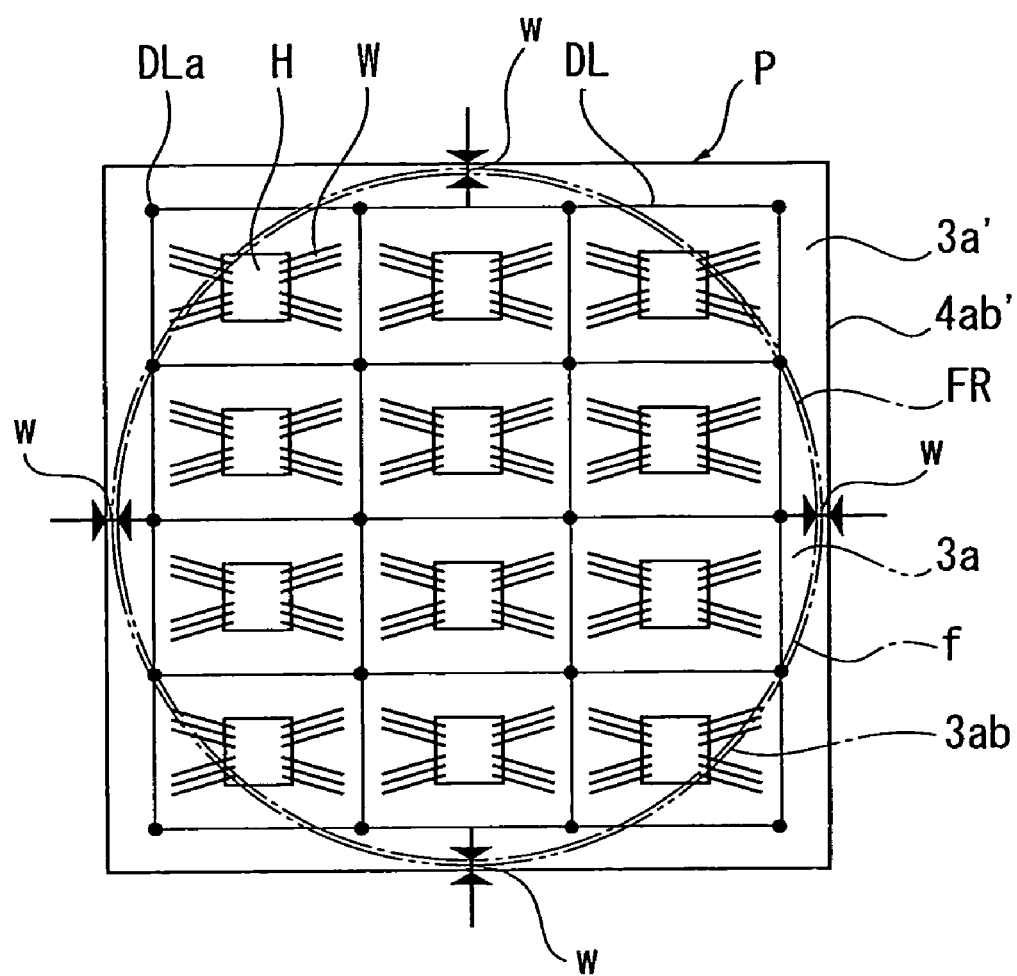
FIG. 14 is a further schematic view for illustrating the shape of a formed resin in the encapsulating/molding apparatus according to the embodiment of the present invention for comparison with the outer shape of the comparison formed resin FR.

In order to vary the shape of the formed resin FR, the size and the shape of the forming receptacle 80 were changed as shown in FIGS. 12 to 14. The tip face 3$a$ of the plunger 3 was designed to have such a maximum area as to receive the formed resin FR in the resin-receiving section 7. By this construction, a contour line 3$ab$ of the tip end 3$a$, which is shown in a chain double-dash line was set greater than the outer contour line (formed outer line) f of the formed resin FR by a range of 0.1+0.1 mm (0.1 mm to 0.2 mm).

In Example 1 illustrated in FIG. 12, a distance w between the outer contour line 4$ab'$ and the formed outer line f of the formed resin FR shown by an alternate long and short chain line was set at about 0.3 mm (plunger size: 37.80×37.45 mm), a radius of curvature of each of four corners FRR of the formed resin FR is set at about 2 mm. Thereby, the ratio of the area of one surface of the formed resin FR relative to that of an area surrounded by the outer contour line 4$ab$ (outer contour line 4$ab'$ of the product) is about 96.5% (measured).

In Example 2 of FIG. 13, the distance w identically defined is set at about 0.6 mm (plunger size; 37.7×37.35 mm), a radius of curvature of each of four corners FRR of the formed resin FR is set at about 10 mm, and the ratio of the area of one surface of the formed resin FR relative to that of an area surrounded by the outer contour line 4$ab$ (outer contour line 4$ab'$ of the product) is about 85.2% (measured).

Further, in Example 3 of FIG. 14, a tip face 3$a$ and a formed resin FR are designed circular, and a minimum width w between the outer contour line 4$ab'$ and the formed outer contour line f is set at about 0.3 mm. Thereby, the ratio of the area of one surface of the formed resin FR relative to that of an area surrounded by the outer contour line 4$ab$ (outer contour line 4$ab'$ of the product) is about 76.5% (measured).

By the above construction, as to the semiconductor package P shown in FIG. 12, the dicing line DL is located inside a frame of the formed outer contour line f of the formed resin FR including four corners DLa. In FIG. 13, the four corners DLa of the dicing line DL expand outwardly from the four corners FRR of the formed FR. In FIG. 14, the formed outer contour line f largely crosses the wires W of the semiconductor package H.

Molding was actually effected under the molding condition that the temperature of the agitating pot 32 was 100° C., the agitating time was 30 seconds, the temperature of the forming receptacle 80 and the forming receiving table 84 was 80° C., the forming pressure was 24.5 KN, the injection pressure of the compression plunger was 9 MPa, the injection time was 8 seconds, the curing time was 100 seconds, and the temperature of the molding die (lower and upper molding units 1 and 2) at 175° C.

By this, the tape substrate having the metallic wires bonded was set in the molding die, and with respect to the encapsulated product P, non-charged state, outer voids, inner voids, and wire flowing were evaluated. Results are shown in Table 2.

TABLE 2

| Item | Example 1 | Example 2 | Example 3 |
|---|---|---|---|
| Width w (mm) | 0.3 | 0.6 | 0.3 |
| Area ratio | 96.5% | 85.2% | 76.5% |
| Non-charged state | 0/3 | 0/3 | 0/3 |
| Outer voids | 0/3 | 0/3 | 0/3 |
| Inner voids | 0/3 | 0/3 | 0/3 |
| Wire sweeping | 2.70% | 8.50% | 10.20% |

From the above results, it is understood that the non-charged state, the outer voids, the inner voids, and the wire flowing were reduced when the shape of the formed resin FR is similar to that of the package and the ratio of the area of the formed resin to the area of the bottom forming face of the lower molding cavity (area of one surface of the product P) is not less than 90%.

In the above, the examples of the present invention have been detailed based on the drawings, but specific constructions of the present invention are not limited thereto. Any changes in design not departing from the gist of the present invention are encompassed by the invention.

As explained before, the resin-encapsulated type semiconductor package-producing method and apparatus can be effected in the inline manner. Even if the process for producing the resin-encapsulated type semiconductor package is entirely automated through the inline system, the wires are unlikely to be flown and the resin waste amount can be reduced. Thus, the present invention ensures high reliability even if the semiconductor becomes larger, thinned and highly integrated. In addition, the present invention is expected to be widely developed as the method and apparatus for the production of the resin-encapsulated type semiconductor packages, which are also fit to the production of other kinds of a small number of products.

What is claimed is:

1. A resin-encapsulated type semiconductor package-producing method comprising feeding a powdery or granular resin composition into a weighing pot and weighing the resin composition, feeding the resin composition from the weighing pot to an agitating pot having a heater, agitating and melting the resin composition in the agitating pot, taking out the agitated and melted resin composition and forming it in the form of a package under pressure, fitting a lead frame or a tape substrate on which semiconductor chips or electronic parts are attached to a cavity of an upper molding die unit of a molding die having a heater, fitting the preshaped resin composition formed in the package shape to a compression plunger inside a cavity of a lower molding unit, after clamping the molding die, obtaining an integrally molded body by encapsulating the semiconductor chips or electronic parts and the lead frame or tape substrate through pressing the resin composition with the compression plunger and molding and curing the resin composition, and taking out the integrally molded semiconductor package from the molding die.

2. The resin-encapsulated type semiconductor package-producing method set forth in claim 1, wherein in the above step, a temperature of the agitating pot having the heater is in a range of 80° C. to 120° C. when the resin composition is melted under agitating.

3. The resin-encapsulated type semiconductor package-producing method set forth in claim 1, wherein in said step, the time for melting the resin composition under agitating is in a range of 10 to 50 seconds.

4. The resin-encapsulated type semiconductor package-producing method set forth in claim 1, wherein in said step, the temperature of the molding die is in a range of 500 to 100° C. with a pressing pressure (forming pressure) of 9.8 KN to 39.2 KN when the resin composition is pressed and formed.

5. The resin-encapsulated type semiconductor package-producing method set forth in claim 1, wherein in said step, the formed resin composition has a shape which is substantially similar to an outer shape of a molding bottom face of the lower cavity and smaller than this outer shape of the cavity of the lower molding unit by a range of 0.1 to 0.5 mm.

6. The resin-encapsulated type semiconductor package-producing method set forth in claim 1, wherein in said step, an area of one face of the formed composition is not less than 90% of that of a molding bottom face of the cavity of the lower molding unit.

7. A resin-encapsulated type semiconductor package obtained by claim 1, diced within a frame defined by an uneven line formed at a bottom face thereof along an outer shape of the end of the compression plunger.

8. A resin-encapsulated type semiconductor package is produced by the producing method set forth in claim 1.

9. The resin-encapsulated type semiconductor package-producing method set forth in claim 2, wherein in said step, the time for melting the resin composition under agitating is in a range of 10 to 50 seconds.

10. The resin-encapsulated type semiconductor package-producing method set forth in claim 2, wherein in said step, the temperature of the molding die is in a range of 500 to 100° C. with a pressing pressure (forming pressure) of 9.8 KN to 39.2 KN when the resin composition is pressed and formed.

11. The resin-encapsulated type semiconductor package-producing method set forth in claim 2, wherein in said step, the formed resin composition has a shape which is substantially similar to an outer shape of a molding bottom face of the lower cavity and smaller than this outer shape of the cavity of the lower molding unit by a range of 0.1 to 0.5 mm.

12. The resin-encapsulated type semiconductor package-producing method set forth in claim 2, wherein in said step, an area of one face of the formed composition is not less than 90% of that of a molding bottom face of the cavity of the lower molding unit.

13. A resin-encapsulated type semiconductor package obtained by claim 2, diced within a frame defined by an uneven line formed at a bottom face thereof along an outer shape of the end of the compression plunger.

14. A resin-encapsulated type semiconductor package is produced by the producing method set forth in claim 2.

15. A resin composition-encapsulated type semiconductor package-producing apparatus comprises a weighing unit for feeding a powdery or granular resin composition into a weighing pot and weighing it, a resin feeder for feeding the resin composition from the weighing pot into an agitating pot having a heater, an agitating/melting unit for agitating and melting the resin composition in the agitating pot, a forming unit for taking out the agitated and melted resin composition and forming it in the form of a package under pressure, a device for attaching an object to be encapsulated, said device being adapted for attaching a lead frame or a tape substrate on which semiconductor chips or electronic parts are attached to a cavity of an upper molding unit of a molding die having a heater, an encapsulating resin-fitting device for fitting the preshaped resin composition formed in the package shape to a compression plunger inside a cavity of a lower molding unit, an encapsulating device for obtaining an integrally molded body, after clamping the molding die, by encapsulating the semiconductor chips or electronic parts and the lead frame or tape substrate through pressing the resin composition with the compression plunger and molding and curing the resin composition, and a takeout device for taking out the resulting semiconductor package from the molding die.

* * * * *